United States Patent [19]

Kogan

[11] Patent Number: 5,298,902
[45] Date of Patent: Mar. 29, 1994

[54] ANALOG-TO-DIGITAL CONVERTER EMPLOYING MULTIPLE PARALLEL SWITCHING CAPACITOR CIRCUITS

[75] Inventor: Grigory Kogan, Portland, Oreg.
[73] Assignee: Tektronix, Inc., Wilsonville, Oreg.
[21] Appl. No.: 986,827
[22] Filed: Dec. 8, 1992
[51] Int. Cl.$^5$ .................. H03M 1/60; H03M 1/00
[52] U.S. Cl. .................. 341/157; 341/141; 341/122
[58] Field of Search ............... 341/157, 141, 122, 155, 341/172, 106, 164

[56] References Cited

U.S. PATENT DOCUMENTS

| | | | |
|---|---|---|---|
| 4,353,057 | 10/1982 | Bernet et al. | 341/122 |
| 4,398,179 | 8/1983 | Kaneko | 341/141 X |
| 4,598,269 | 7/1986 | Penney . | |
| 4,663,610 | 5/1987 | Metz et al. . | |
| 4,677,422 | 6/1987 | Naito | 341/141 X |
| 4,774,498 | 9/1988 | Traa . | |
| 4,933,676 | 6/1990 | Hauge et al. | 341/141 |
| 5,061,926 | 10/1991 | Washiyama | 341/141 X |
| 5,202,686 | 4/1993 | Rapp et al. | 341/141 X |

Primary Examiner—Sharon D. Logan
Attorney, Agent, or Firm—Boulden G. Griffith

[57] ABSTRACT

A multi-channel analog-to-digital converter includes a counter (20) and a plurality of analog-to-digital conversion cells (10), each of which contain incremental discharge means (11-16) that store a charge proportional to the voltage value of an analog input signal and discharge that charge in increments upon the occurrence of the clock signal, also producing an active signal after the charge has been stored and before the incremental discharge is complete. A register (17) receives a count signal from the counter (20) and stores its value when the active signal goes inactive. A multiplexer (18) selects among the outputs of the plurality of analog-to-digital conversion cells (10) and supplies the selected output as a digital output signal. Linearizing means, such as a lookup ROM (30), receive the digital output signal and from it produce a digital value signal that is indicative of the voltage level of the analog input signal associated with the analog-to-digital conversion cell (10) currently selected by the multiplexer (18).

3 Claims, 6 Drawing Sheets

ANALOG-TO-DIGITAL CONVERTER EMPLOYING MULTIPLE PARALLEL SWITCHING CAPACITOR CIRCUITS

FIELD OF THE INVENTION

This invention relates to the field of analog to digital conversion, and more particularly to an analog-to-digital converter based on multiple switching capacitor analog-to-digital conversion circuits operating in concert with each other.

BACKGROUND OF THE INVENTION

FIG. 1 shows a switching capacitor circuit according to the prior art. An ANALOG IN signal is connected by a first switch to the input of a Schmidt trigger circuit when a HOLD signal is active high. A second switch under the control of a CK1 signal connects the input of the Schmidt trigger to a first side of a capacitor CAP2 when CK1 is active high. A third switch under the control of a CK2 signal connects the first side of capacitor CAP2 to ground when CK2 is active high. The second side of CAP2 is connected directly to ground. Another capacitor CAP1 is connected between the input of the Schmidt trigger and ground.

The output of the Schmidt trigger is /EOC, a Not End Of Conversion signal. /EOC is both an output of the circuit and an input to an AND gate whose other input is the CK2 signal. The output of the AND gate is CK, which is also the clock input to a counter. The counter has a RESET input and produces as its output a DIGITAL COUNT signal. The DIGITAL COUNT signal is converted by a ROM lookup table into a DIGITAL VALUE corresponding to the voltage level of the ANALOG IN signal when /EOC goes low indicating that the analog to digital conversion process is complete.

FIG. 2 is a timing diagram illustrating the operation of the circuit shown in FIG. 1. As shown in FIG. 2, the HOLD, RESET, and CK2 signals initially all go high at the same time. The active high level of the HOLD signal connects the ANALOG IN signal to the input of the Schmidt trigger and CAP1, while the active high RESET signal resets the counter. The active high CK2 signal connects the first side of CAP2 to ground. Thus, at this time, CAP1 is charged to the voltage level of the ANALOG IN signal, CAP2 is discharged to ground, and the counter is reset. Since the counter is now reset, /EOC goes high at this time. A high /EOC and high CK2 enable the AND gate, and CK goes high for the duration of CK2.

After the activity just described, the HOLD, RESET, and CK2 signals return to their inactive low states, thereby opening the first and third switches and freeing the counter to count. Then, upon the occurrence of CK1 going active high, the second switch is closed, connecting CAP2 to CAP1. Since CAP2 is significantly smaller than CAP1, CAP2 now charges to nearly the original voltage level of CAP1, while CAP1 is slightly discharged in response. When CK1 returns to its inactive low state the charge on CAP2 is isolated. The next high on CK2 discharges CAP2 to ground, after which this cycle is repeated. Each time that CAP2 is charged and discharged the charge remaining on CAP1 is decreased. However, while the charge on CAP1 remains above the threshold of the Schmidt trigger, the output of the Schmidt trigger, /EOC, remains high and the AND gate remains enabled. And, while the AND gate is enabled, each time that CK2 goes high, the AND gate produces another active high CK signal, causing another count of the counter.

The DIGITAL COUNT final value that is present when /EOC goes low has a non-linear but monotonic relationship to the voltage level present at the ANALOG IN input when the HOLD signal caused it to be sampled. A low on /EOC acts as a read enable signal to the ROM lookup table to convert the DIGITAL COUNT value to a DIGITAL VALUE that is directly proportional to the ANALOG IN signal voltage level when it was sampled. The ROM lookup table values are determined empirically as part of an end-to-end initial calibration procedure, as is well known in the art.

Because the switching capacitor circuit shown in FIG. 1 requires a fairly large number of clock (CK1, CK2, and CK) cycles to perform its function, it is relatively slow and therefore unsuitable for some applications.

U.S Pat. No. 5,144,525 to Saxe et al. for an "Analog Acquisition System Including a High Speed Timing Generator", hereby incorporated by reference, discloses an analog signal acquisition system which is suitable for use in a high speed analog oscilloscope. In this system, the input signal is rapidly and repetitively sampled by a succession of analog capture cells. The contents of these capture cells are then transferred to an array of analog memory cells as part of a fast-in, slow-out (FISO) system architecture. In such a system, a means is required for performing rapid analog-to-digital conversion of the numerous analog samples that are acquired with such rapidity.

SUMMARY OF THE INVENTION

The present invention provides a circuit architecture for a high throughput multi-channel analog-to-digital converter that includes a counter and a plurality of analog-to-digital conversion cells, each of which contains an incremental discharge circuit similar to that shown in FIG. 1. The incremental discharge circuit stores a charge proportional to the voltage value of an analog input signal and discharge that charge in increments upon the occurrence of the clock signal, also producing an active signal after the charge has been stored and before the incremental discharge is complete. A register receives a count signal from the counter and stores its value when the active signal goes inactive. A multiplexer selects among the outputs of the plurality of analog-to-digital conversion cells and supplies the selected output as a digital output signal. Linearizing means, such as a lookup ROM, receive the digital output signal and from it produce a digital value signal that is indicative of the voltage level of the analog input signal associated with the analog-to-digital conversion cell currently selected by the multiplexer. In one embodiment, a gate receives the periodic clock signal and an end of conversion signal and provides a gated periodic clock signal to a down counter which is preloaded with an initial value. Another gate monitors the output of the down counter and produces the end of conversion signal when the count reaches zero. In another embodiment, a NOR gate equivalent generates an end of conversion signal when all of the active signals from the plurality of cells become inactive.

DETAILED DESCRIPTION OF THE INVENTION

Figure 1:
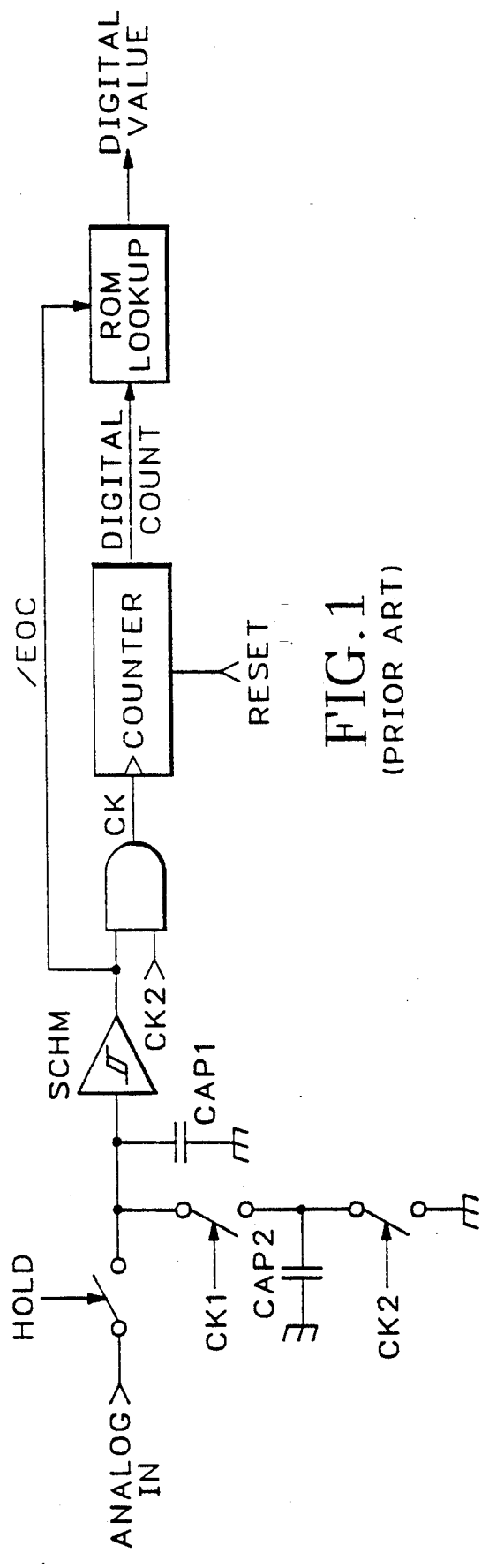
FIG. 1 is a schematic diagram of a switching capacitor type analog-to-digital converter according to the prior art.
Figure 2:
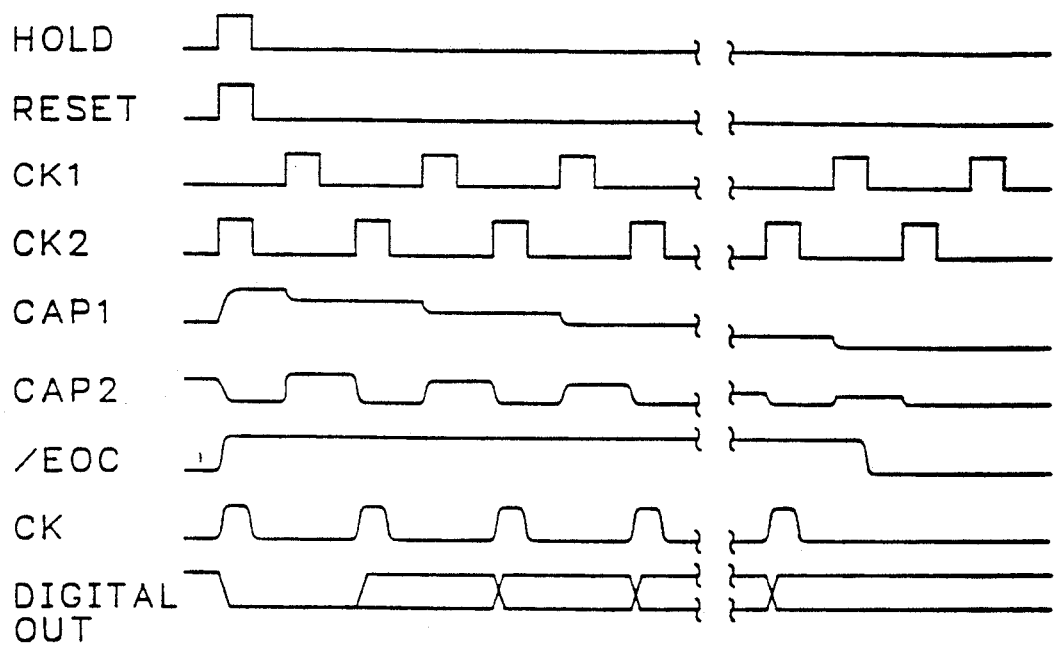
FIG. 2 is a timing diagram illustrating the operation of the circuit shown in FIG. 1.
Figure 3:
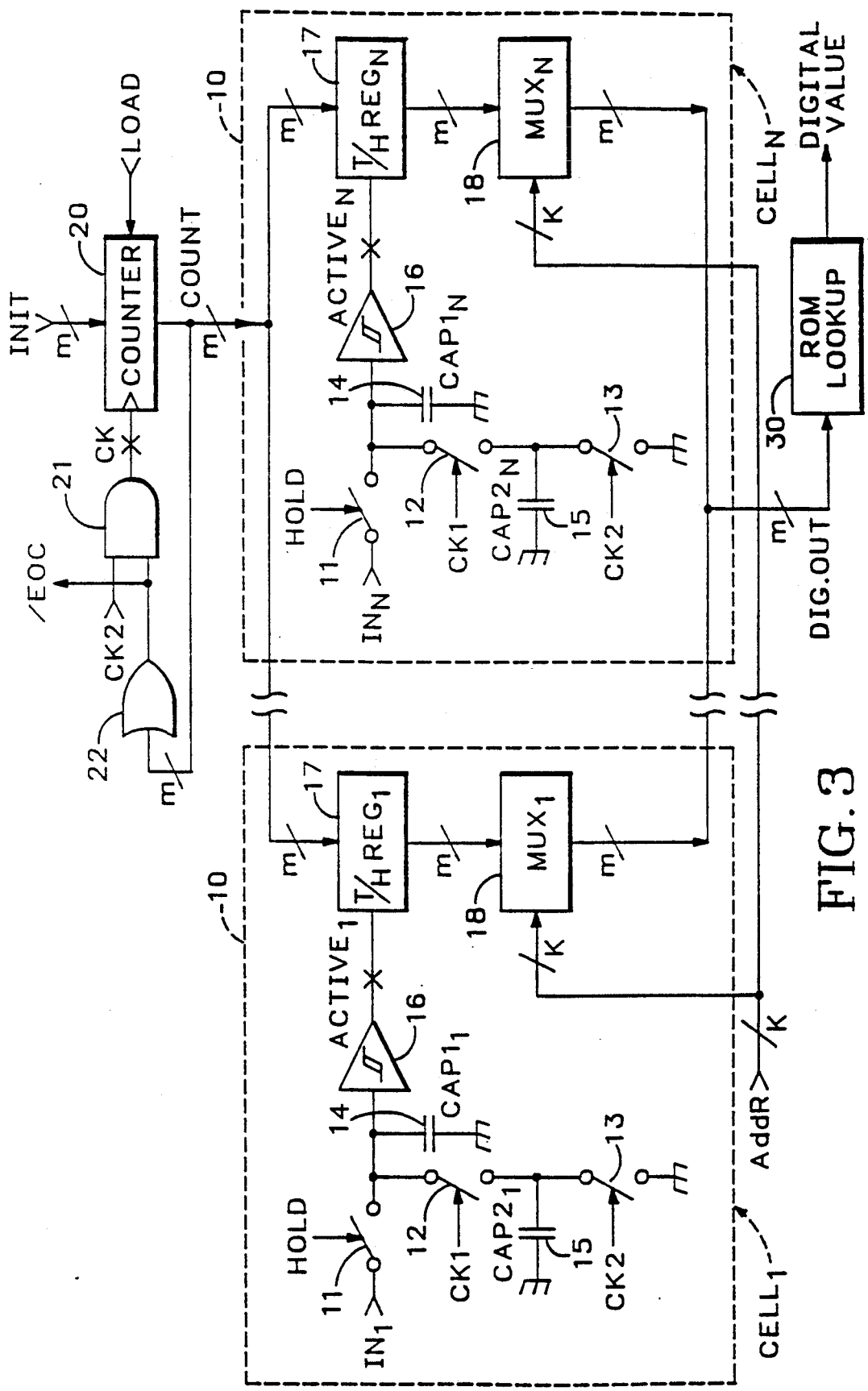
FIG. 3 is a schematic diagram of a first embodiment of a high throughput parallel arrangement of switching capacitor analog-to-digital converter cells according to the present invention.

Refer now to FIG. 3 which shows a schematic diagram of a first embodiment of a high throughput parallel arrangement of switching capacitor analog-to-digital converters cells 10 according to the present invention.

Each switching capacitor cell 10 has first, second, and third switches 11, 12, and 13, under the respective control of HOLD, CK1, and CK2, as in the prior art circuit. And, each cell 10 also contains two capacitors, $CAP1_x$ 14 and $CAP2_x$ 15, where X identifies the number of the particular cell in the high throughput parallel arrangement of such cells, $CELL_1$-$CELL_4$. These switches and capacitors are configured exactly as they were in the prior art cell, and are connected to the input of a Schmidt trigger 15. Collectively, this circuitry will be referred to as an "incremental discharge circuit".

In contrast to the prior art cells, in the cells 10 of the present invention the output of the Schmidt trigger 15, $ACTIVE_x$, is applied to the track/hold input of a register $REG_x$ 17. The register $REG_x$ 17 stores an m-bit digital COUNT value on its data input when the signal on its track/hold input goes low. The m-bit output of register $REG_x$ 17 is monitored by multiplexer $MUX_x$, which produces it as an m-bit output when that particular cell 10 is selected by k-bits of ADDRess signal to the multiplexer.

The COUNT value on the input of registers $REG_1$-$REG_N$ is the output of a counter 20 that is clocked by CK, the output of an AND gate 21. AND gate 21 passes the CK2 signals on one of its inputs while it is enabled by a high on its other input. The other input to AND gate 21 is the output of OR gate 22, /EOC (not end of conversion). OR gate 22 monitors all of the m-bits of the COUNT signal output of counter 20 and produces a high /EOC output while the COUNT value is non-zero. When the COUNT reaches all zeros, either by counting up or counting down, OR gate 22 is satisfied and /EOC goes low. A low /EOC disables AND gate 21 so that CK2 pulses no longer produce CK pulses, and the counter ceases to count. Counter 20 is preloaded with an INIT value when its LOAD input goes active.

Figure 4:
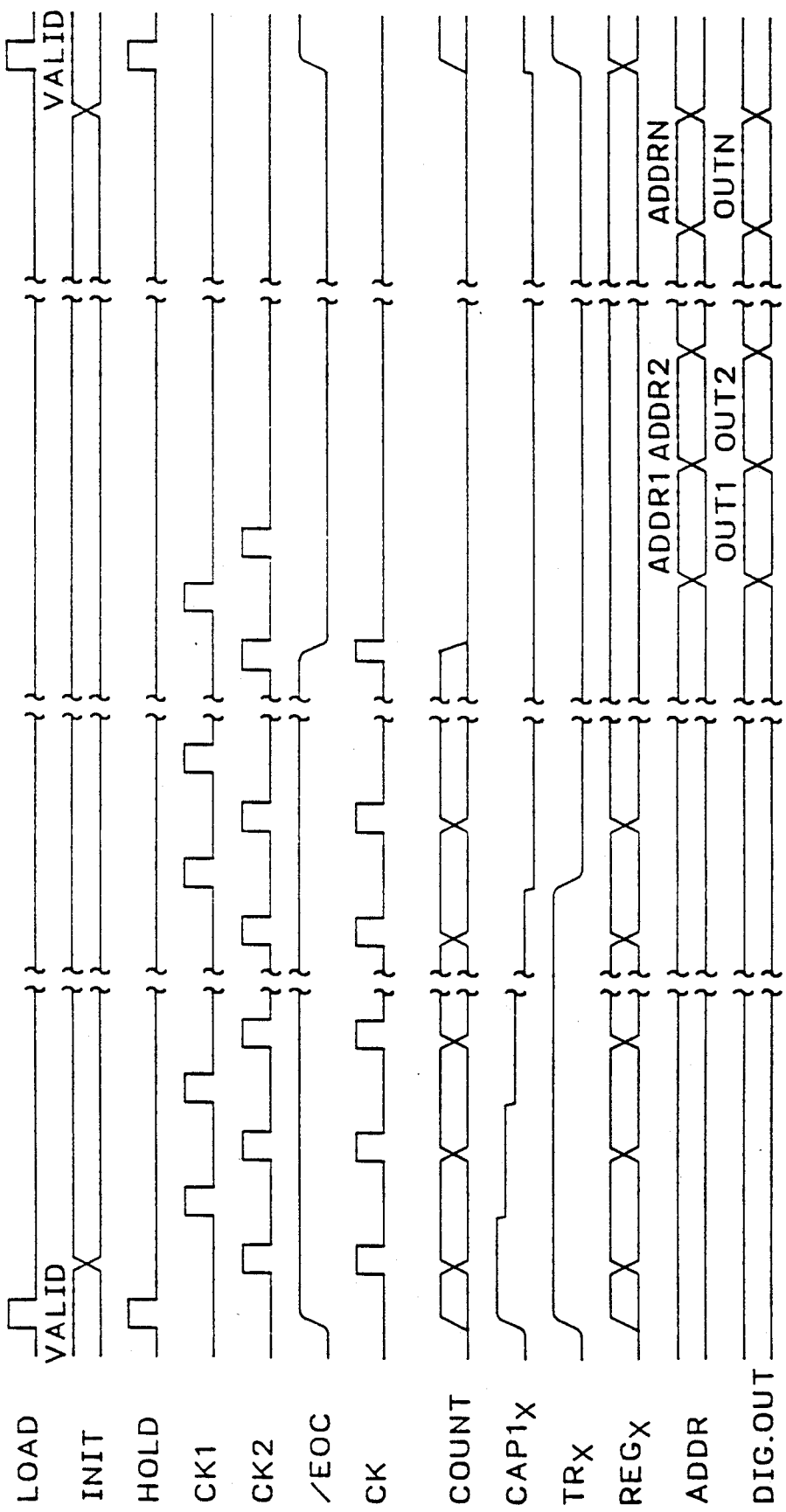
FIG. 4 is a timing diagram illustrating the operation of the circuit shown in FIG. 3.

The operation of the circuit shown in FIG. 3 will now be explained by reference to the timing diagram shown in FIG. 4. When the LOAD signal goes high, the value of INIT is loaded into counter 20. When the COUNT output of the counter 20 becomes non-zero, OR gate 22 is disabled and /EOC goes high. At the same time that LOAD goes high, HOLD also goes high. The high HOLD signal closes switch 11 of each cell 10 causing the analog IN signal level to be stored on capacitor $CAP1_x$. The charge on $CAP1_x$ is generally higher than the input threshold of Schmidt trigger 16, and so $ACTIVE_x$ also goes high at this time. The high outputs of the $ACTIVE_x$ signals cause the registers $REG_x$ to be in their track (transparent) mode of operation.

The first high pulse on CK2 discharges $CAP2_x$ to ground. A high-going pulse on CK occurs at the same time as the first pulse on CK2. Each CK pulse causes counter 20 to count, changing the COUNT value. Each succeeding high pulse on CK1 connects $CAP2_x$ to $CAP1_x$, causing the charge remaining on $CAP1_x$ to decrease. Another CK2 pulse occurs between each pair of CK1 pulses, discharging $CAP2_x$ to ground again. Additional CK pulses occur at the same time as each CK2 pulse, so that COUNT is incremented (or decremented) for each time that a charge is removed.

Eventually, the charge on each $CAP1_x$ falls below the threshold of the associated Schmidt trigger 16, and the corresponding $ACTIVE_x$ signal goes low. The low on each $ACTIVE_x$ signal switches the $REG_x$ for that cell 10 from its track to its hold mode of operation, leaving the last value of COUNT saved in that register 17. As previously described, when COUNT reaches zero the output OR gate 22 goes low, causing AND 21 to become disabled. The INIT value is made large enough to ensure that the registers 17 in all cells 10 have switched from tracking to holding before COUNT reaches zero (or terminal count).

The multiplexers $MUX_x$ 18 can then be addressed to sequentially read out the final values held in the registers $REG_x$ to produce the DIGITAL COUNT data. These DIGITAL COUNT values are then converted by RAM lookup 30 into DIGITAL VALUES representing the analog input values that were present on $IN_1$-$IN_N$ at the time HOLD went from high to low and the sample was stored. A second set of circuitry such as that shown in FIG. 3 can alternate with a first set to provide continuous time coverage of the $IN_x$ signals, i.e., one set of circuitry can be read out while another is performing its analog-to-digital conversions.

Figure 5:
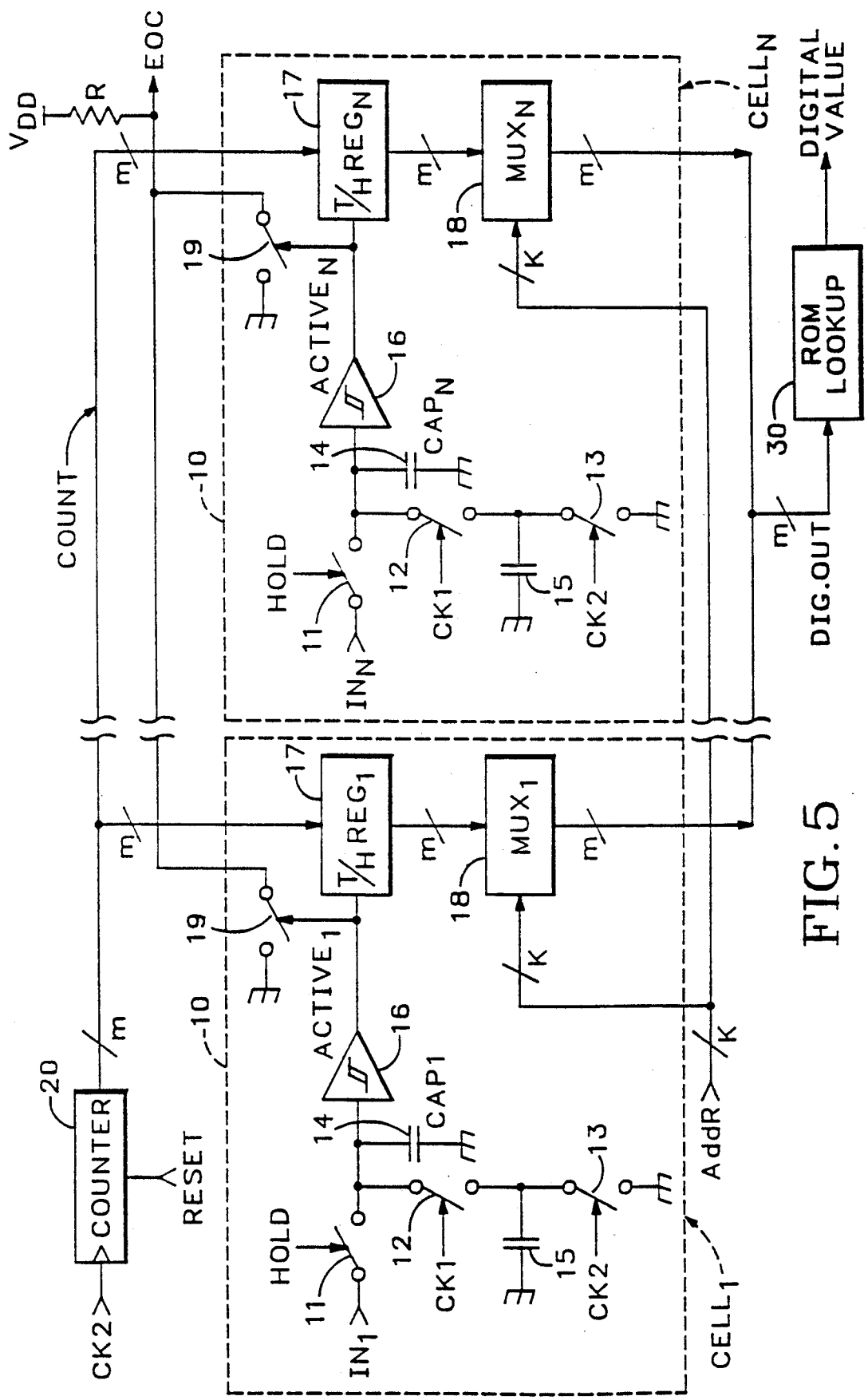
FIG. 5 is a schematic diagram of a second embodiment of a high throughput parallel arrangement of switching capacitor analog-to-digital converters according to the present invention.
Figure 6:
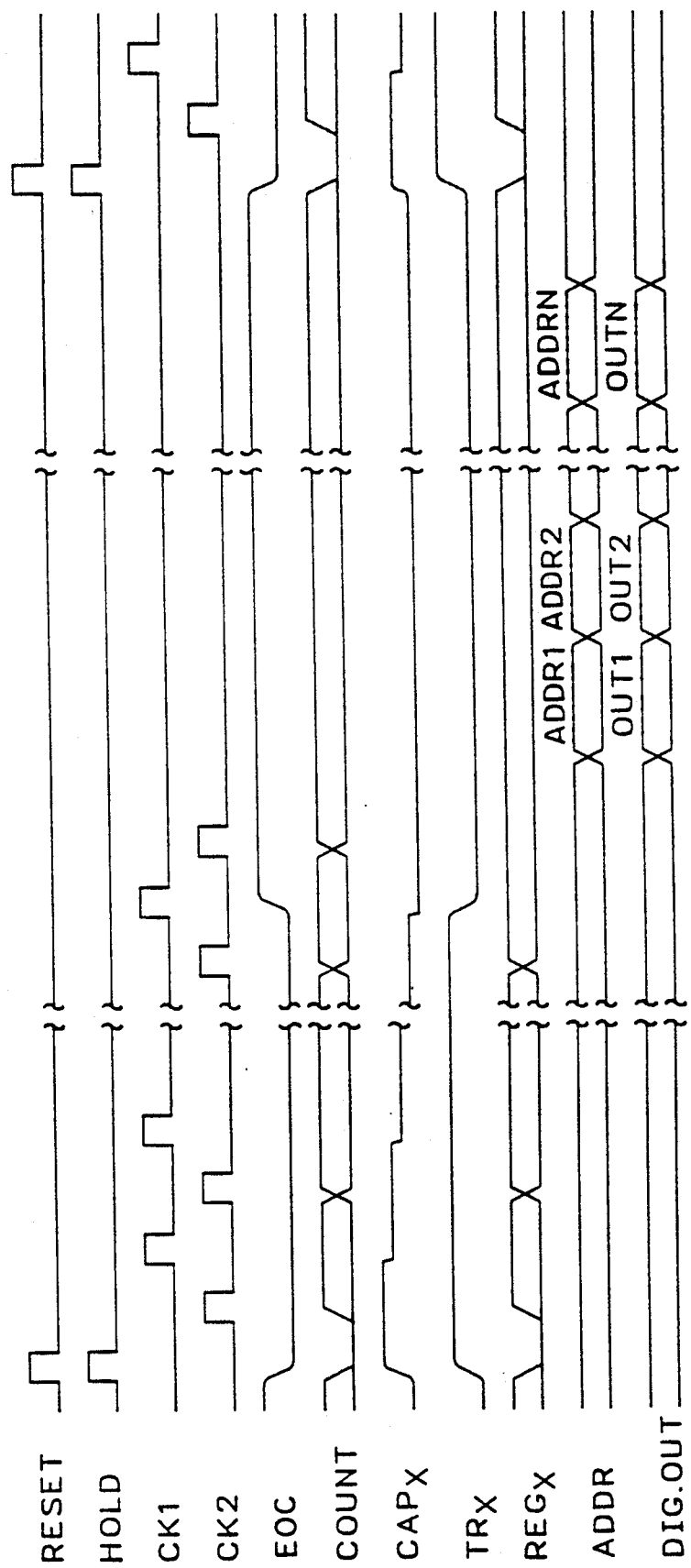
FIG. 6 is a timing diagram illustrating the operation of the circuit shown in FIG. 5.

Refer next to FIG. 5, which shows an alternative embodiment of a high throughput parallel arrangement of switching capacitor analog-to-digital converters according to the present invention. This version of the invention only differs from that shown in FIG. 3 in the way that the EOC (end of conversion) signal is generated and in the way that the counter 20 is controlled. The counter 20 is now directly clocked by CK2 and reset to an all zeros state by a RESET signal. EOC is now generated by the $ACTIVE_x$ signals from the cells 10. While the $CAP1_x$ capacitors 14 are above the input thresholds of the Schmidt triggers 16, the high state of the $ACTIVE_x$ signals keep their respective switches 19 closed (conducting, "on" transistors). While any switch 19 is closed, EOC is connected to ground. When the last $ACTIVE_x$ signal goes low and the last switch 19 opens, there is no longer any conduction path through pull-up resistor R and EOC goes to $V_{DD}$, i.e., high. Thus, EOC goes high when the last $ACTIVE_x$ signal goes low, and the overall effect is analogous to that of a NOR gate.

An advantage of the circuit shown in FIG. 5 over that of the circuit shown in FIG. 3 is that the number of clock cycles required for conversion is not fixed, but rather depends on the highest voltage level of any of the analog input signals to be converted, thus permitting higher throughput when only lower voltage levels are being converted.

While a preferred embodiment of the present invention has been shown and described, it will be apparent to those skilled in the art that many changes and modifications may be made without departing from the invention in its broader aspects. For example, ROM lookup 30 could be replaced by any other means for linearizing the non-linear data in DIG.OUT. Similarly, a different circuit arrangement could operate as the incremental discharge circuit (11-16). The claims that follow are therefore intended to cover all such changes and modifications as fall within the true scope and spirit of the invention.

What is claimed is:

1. A multi-channel analog-to-digital converter comprising:

counting means (20) for receiving a clock signal and producing a count signal;

a plurality of analog-to-digital conversion cells (10), each cell containing:

incremental discharge means (11-16) for storing a charge proportional to the voltage value of an analog input signal and discharging the charge in increments upon the occurrence of the clock signal, the incremental discharge means (11-16) producing an active signal after the charge has been stored and before the incremental discharge is complete, and register means (17) for receiving the count signal and the active signal and storing a value of the count signal when the active signal goes inactive, the stored value being the output of the cell;

multiplexing means (18) for selecting among the outputs of the plurality of analog-to-digital conversion cells (10) and supplying the selected output as a digital output signal; and linearizing means (30) for receiving the digital output signal and producing a digital value signal indicative of a voltage level of the analog input signal associated with the analog-to-digital conversion cell (10) selected by the multiplexing means (18).

2. An analog-to-digital converter according to claim 1 wherein the counting means comprises:

gating means ((21) for receiving the clock signal and an end of conversion signal and providing a gated clock signal;

a down counter (20) responsive to the gated clock signal;

means for preloading the down counter (20) with an initial value; and means (22) for generating the end of conversion signal when the count of the down counter (20) reaches zero.

3. An analog-to-digital converter according to claim 1 further comprising means for generating (19,R) an end of conversion signal when all of the active signals from the plurality of cells (10) become inactive.

* * * * *